(12) United States Patent
Hunton et al.

(10) Patent No.: US 6,998,916 B2
(45) Date of Patent: Feb. 14, 2006

(54) FEED FORWARD AMPLIFIER SYSTEM USING PENALTIES AND FLOORS FOR OPTIMAL CONTROL

(75) Inventors: Matthew J. Hunton, Liberty Lake, WA (US); Richard Neil Braithwaite, Orange, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 40 days.

(21) Appl. No.: 10/733,087

(22) Filed: Dec. 11, 2003

(65) Prior Publication Data

US 2004/0119535 A1   Jun. 24, 2004

Related U.S. Application Data

(60) Provisional application No. 60/434,825, filed on Dec. 18, 2002.

(51) Int. Cl.
*H03F 1/26*  (2006.01)
*H03F 3/66*  (2006.01)

(52) U.S. Cl. ........................................ 330/151; 330/52
(58) Field of Classification Search .................. 330/52, 330/144, 149, 151, 284
See application file for complete search history.

(56) References Cited

U.S. PATENT DOCUMENTS

| | | | |
|---|---|---|---|
| 4,580,105 A | 4/1986 | Myer | 330/149 |
| 5,023,565 A | 6/1991 | Lieu | 330/151 |
| 5,130,663 A | 7/1992 | Tattersall, Jr. | 330/52 |
| 5,444,418 A | 8/1995 | Mitzlaff | 330/52 |
| 5,485,120 A | 1/1996 | Anvari | 330/151 |
| 5,570,063 A | 10/1996 | Eisenberg | 330/149 |
| 5,796,304 A | 8/1998 | Gentzler | 330/52 |
| 5,955,921 A | 9/1999 | Ide et al. | 330/254 |
| 6,028,477 A | 2/2000 | Gentzler | 330/149 |

(Continued)

OTHER PUBLICATIONS

Feedforward—An Alternative Approach to Amplifier Linearization, T.J. Bennett, R.F. Clements, *The Radio and Electronic Engineer*, vol. 44, No. 5, May 1974.

*Primary Examiner*—Steven J. Mottola
(74) *Attorney, Agent, or Firm*—Myers Dawes Andras & Sherman LLP

(57) ABSTRACT

A feed forward amplifier employing a new adaptive controller and method is disclosed. The controller aligns both a gain adjuster and phase adjuster of a first cancellation loop. The phase adjuster may be controlled following a standard approach. However, the gain adjuster is offset intentionally causing an incomplete cancellation, increasing the signal power passing through the error amplifier. If the gain adjuster is offset low, below the gain adjustment required to maximize carrier cancellation, peak power output from the main amplifier is reduced while the second loop maintains constant system output power. If the gain adjuster is offset high, peak power output from the error amplifier is reduced while the second loop maintains constant system output power. By controlling the gain adjuster offset from full first loop cancellation, the feed forward amplifier can be optimized for the power handling capabilities of the main and error amplifiers. A system and method of specifying and controlling the steady-state offset of the first loop gain adjuster is also disclosed. By altering the cost function of the first loop gain, the desired gain adjuster offset becomes the steady-state adjustment. Floors and penalties are incorporated into the first loop gain minimization approach to allow precise specification of the gain adjuster offset. The gain adjuster offset can be controlled at will to optimize the feed forward system even when the operating conditions or goals are varying.

29 Claims, 9 Drawing Sheets

U.S. PATENT DOCUMENTS

| | | | |
|---|---|---|---|
| 6,259,319 B1 | 7/2001 | Ghanadan et al. | 330/149 |
| 6,340,914 B1 | 1/2002 | Gavrilovic | 330/52 |
| 6,441,686 B1 | 8/2002 | Nakamura | 330/85 |
| 6,452,446 B1 | 9/2002 | Eisenberg et al. | 330/52 |
| 6,552,608 B1 | 4/2003 | Matsuda et al. | 330/52 |
| 6,553,211 B1 | 4/2003 | Zhou | 455/126 |
| 6,563,385 B1 | 5/2003 | Wojslaw | 330/296 |
| 6,573,793 B1 | 6/2003 | Gutierrez | 330/151 |
| 6,587,514 B1 | 7/2003 | Wright et al. | 375/296 |
| 6,593,811 B1 | 7/2003 | Schemmann et al. | 330/110 |
| 6,608,523 B1 | 8/2003 | Ly | 330/52 |
| 2001/0022532 A1 | 9/2001 | Dolman | 330/149 |
| 2002/0049513 A1 | 4/2002 | Nussbaum et al. | 700/186 |
| 2003/0042979 A1 | 3/2003 | Gurvich et al. | 330/151 |
| 2003/0052734 A1 | 3/2003 | Ishigami et al. | 330/151 |
| 2003/0107436 A1 | 6/2003 | Kenington | 330/149 |
| 2004/0124920 A1* | 7/2004 | Hunton et al. | 330/151 |

* cited by examiner

FEED FORWARD AMPLIFIER SYSTEM USING PENALTIES AND FLOORS FOR OPTIMAL CONTROL

RELATED APPLICATION INFORMATION

The present application claims the benefit of provisional application Ser. No. 60/434,825 filed Dec. 18, 2002, the disclosure of which is incorporated herein by reference in its entirety.

BACKGROUND OF THE INVENTION

1. Field of the Invention

The present invention relates to RF power amplifiers and amplification methods. More particularly, the present invention relates to feed forward amplifiers and methods for controlling feed forward amplifiers.

2. Description of the Prior Art and Related Background Information

RF amplifiers are devices that attempt to replicate a RF signal present at its input, producing an output signal with a much higher power level. The increase in power from the input to output is referred to as the 'gain' of the amplifier. When the gain is constant across the dynamic range of the input signal, the amplifier is said to be 'linear'. Amplifiers have limited capacity in terms of power delivered because of gain and phase variances, particularly saturation at high power, which makes all practical amplifiers nonlinear when the input power level varies. The ratio of the distortion power generated relative to the signal power delivered is a measure of the non-linearity of the amplifier.

In RF communication systems, the maximum allowable non-linearity of the amplifier is specified by government agencies such as the FCC or the ITU. Because amplifiers are inherently nonlinear when operating near saturation, the linearity requirements often become the limitation on rated power delivering capability. In general, when operating near saturation, the linearity of the amplifier degrades rapidly because the incremental signal power delivered by an amplifier is proportionally less than the incremental distortion power generated.

Various compensation approaches are conventionally applied to reduce the distortion at the output of the system, which in turn increases the rated power delivering capability. The preferred approach is feed forward compensation. In feed forward RF power amplifiers an error amplifier is employed to amplify main amplifier distortion components which are then combined out of phase with the main amplifier output to cancel the main amplifier distortion component. In general, feed forward compensation provides the power capability of the main amplifier and the linearity of the error amplifier.

The performance of a feed forward amplifier may typically be analyzed based on two cancellation loops. Loop1, called the carrier cancellation loop, includes the RF input and the main amplifier. In addition to the main amplifier signal output the first loop provides a distortion signal obtained by sampling the main amplifier output and combining it with an out of phase sample of the RF input signal. Conventionally, the gain and phase of the signal in loop1 are controlled to ideally provide a distortion signal with the input RF carrier component completely cancelled and only the distortion component remaining. Loop 2 is typically referred to as the error cancellation loop or auxiliary path loop. In loop 2 the distortion component provided from loop 1 is amplified by the error amplifier and injected back into the main path at an error coupler to cancel the distortion component in the main path and ideally provide a distortion free signal at the output.

One problem with this traditional approach to loop control is error coupler loss. The output power capability of the system drops due to losses in the error coupler that recombines the error path signal with the (delayed) main path signal. To reduce this coupler loss the first loop gain adjustment may be varied. However, when the gain is varied from optimal carrier cancellation, more load is carried by the error amplifier. This may in some cases require a larger error amplifier, increasing system costs.

Therefore, a need presently exists for an improved feed forward amplifier and method for controlling loop cancellation which can address this and related problems in optimizing system performance.

SUMMARY OF THE INVENTION

In a first aspect the present invention provides a feed forward amplifier comprising an input for receiving an RF signal, a main amplifier receiving and amplifying the RF signal, and a gain adjuster coupled between the RF input and the main amplifier. The feed forward amplifier further comprises a main amplifier output sampling coupler, a first delay coupled to the input and providing a delayed RF signal, and a carrier cancellation combiner coupling the delayed RF signal to the sampled output from the main amplifier. A test coupler is provided for sampling the output of the carrier cancellation combiner. The feed forward amplifier further comprises an error amplifier which receives and amplifies the output of the carrier cancellation combiner. A second delay is coupled to the output of the main amplifier and an error coupler combines the output from the error amplifier and the delayed main amplifier output from the second delay so as to cancel distortion introduced by the main amplifier. An output is coupled to the error coupler output and provides an amplified RF signal. The feed forward amplifier further comprises an adaptive controller, coupled to the test coupler, for controlling the gain adjuster setting to provide a gain adjustment which is offset from a gain adjustment which maximizes carrier cancellation at the carrier cancellation combiner, which offset is adjustable by changing the floor of a gain adjustment cost function.

In a preferred embodiment the feed forward amplifier may further comprise an input reference coupler for sampling the RF signal provided to the input. The adaptive controller is coupled to the input reference coupler and derives a first loop gain value from the signals from the test coupler and input reference coupler. The feed forward amplifier may also further employ a first signal power detector and a first analog to digital converter coupled between the input reference coupler and the controller and a second signal power detector and a second analog to digital converter coupled between the test coupler and the controller. The feed forward amplifier may also further include a phase adjuster coupled between the input and the main amplifier. The controller may control the phase adjuster to provide a phase adjustment which maximizes carrier cancellation at the carrier cancellation combiner. In a preferred embodiment, the adaptive controller comprises a processor implementing a cost minimization search algorithm. The cost minimization search algorithm preferably includes a penalty based on the direction of gain adjustment. The feed forward amplifier may also employ a pilot signal which is injected into the signal path before the main amplifier. A pilot signal detector is coupled to the output and the controller receives the detected pilot signal. The feed forward amplifier may also comprise a second gain adjuster and a second phase adjuster coupled between the carrier cancellation combiner and the error amplifier and the controller adjusts the setting of the second gain adjuster and second phase adjuster based on the detected pilot signal.

According to another aspect the present invention provides a feed forward amplifier comprising an input for receiving an RF input signal and a first control loop coupled to the input. The first control loop comprises a main amplifier, a sampling coupler, a delay, and a cancellation combiner, and has a gain. The feed forward amplifier further comprises a second control loop coupled to the first control loop comprising a delay, an error amplifier, and an error coupler. An output is coupled to the error coupler. The feed forward amplifier further comprises means for detecting the first control loop gain, and means, coupled to the means for detecting, for controlling the first control loop gain to stabilize the control loop gain at a value offset from a minimum of a loop gain control function.

In a preferred embodiment, the means for controlling comprises a gain adjuster in the first control loop between the input and main amplifier and a processor implementing a loop control algorithm and providing variable adjuster settings to the gain adjuster. The means for detecting preferably comprises an input reference coupler coupled to the input and a test coupler coupled to the output of the carrier cancellation combiner. The means for detecting may also further comprise a first signal power detector coupled to the input reference coupler and a second signal power detector coupled to the test coupler. The means for detecting may further comprise a first analog to digital converter coupled to the first signal power detector and outputting a first digital power signal to the processor and a second digital to analog converter coupled to the second signal power detector and outputting a second digital power signal to the processor. The processor may determine the first control loop gain from the first and second digital power signals. The processor and algorithm preferably provide control of first loop gain by calculating a cost function associated with the adjuster settings, which cost function is derived from the detected first control loop gain and a preset floor value of the cost function. The processor and algorithm vary the adjuster settings employing the cost function to move the calculated cost function toward the preset floor value. The processor and algorithm may further add a penalty to the cost function if the cost function is at the floor value and the adjuster setting is moving in an undesired direction. The undesired direction may correspond to increasing gain adjuster settings or decreasing gain adjuster settings, depending on the specific implementation.

According to another aspect the present invention provides a method for amplifying an RF input signal employing feed forward compensation. The method comprises receiving an RF input signal, amplifying the RF input signal employing a main amplifier, and sampling the main amplifier output. The method further comprises delaying the RF input signal and providing a delayed RF input signal, coupling the delayed RF input signal to the sampled output from the main amplifier so as to cancel at least a portion of a carrier component of the sampled output from the main amplifier and providing a carrier canceled signal having a carrier component and a distortion component. The method further comprises amplifying the carrier canceled signal employing an error amplifier to provide an error signal, delaying the output of the main amplifier, combining the error signal and the delayed output of the main amplifier so as to cancel distortion introduced by the main amplifier and providing an amplified RF output. The method further comprises adjusting the gain of the signal input to the main amplifier by a variable gain setting and controlling the adjusting of the gain of the signal to a steady state setting offset from a setting which minimizes the carrier component of the carrier canceled signal by employing a gain control cost function having a floor and a penalty associated with the direction of the adjusting.

In one preferred embodiment of the method for amplifying an RF input signal employing feed forward compensation the penalty is associated with increasing the gain of the signal and the steady state setting is offset below a setting which minimizes the carrier component of the carrier canceled signal. In an alternate embodiment the penalty is associated with decreasing the gain of the signal and the steady state setting is offset above a setting which minimizes the carrier component of the carrier canceled signal. The floor of the cost function defines a plurality of gain settings having equal cost and the steady state setting preferably comprises one of the plurality of gain settings having equal cost. For example, the steady state setting may comprise the lowest gain setting having equal cost or the highest gain setting having equal cost, depending on the application. The gain control cost function may be viewed as having a lower boundary defined by the floor, the lower boundary having first and second edges. The steady state setting preferably corresponds to one of the first and second edges of the lower boundary of the cost function.

According to another aspect the present invention provides an adaptive controller for controlling a loop of an amplifier system. The adaptive controller comprises a first input for receiving a loop input power level, a second input for receiving a loop output power level, and a processor coupled to the first and second inputs and programmed with a loop control algorithm to provide as an output adjuster settings based on the loop input power level and the loop output power level. The loop control algorithm comprises a cost function having a floor value and a penalty associated with the direction of adjustment of the settings.

According to another aspect the present invention provides a method for controlling an amplifier system having a control loop comprising a control loop input, a main signal path including an amplifier, and a control loop output. The method comprises determining a loop gain from signal levels at the control loop input and control loop output and comparing the loop gain to a floor value. If the loop gain is greater than said floor value a loop control cost function is set equal to the loop gain and if the loop gain is less than the floor value, the loop control cost function is set equal to the floor value. The method further comprises determining the adjustment direction of the loop control and, if the loop control is adjusting in an undesired direction adding a penalty to the floor value to derive a new cost function. The method further comprises adjusting the gain of the main signal path so as to minimize the value of the cost function.

According to another aspect the present invention provides a method of adjusting the steady state control setting of a control loop of an amplifier system. The method comprises setting an initial floor value of a loop control cost function to a first value near a minimum possible value of the cost function, adding a penalty to the loop control cost function based on the direction of adjustment of the control setting, and controlling the loop to minimize the loop control cost function incorporating the floor and penalty. The method further comprises increasing the floor value of the loop control cost function while monitoring the performance of the amplifier system. A final floor value of the loop control cost function is set near a value where increasing the floor value further causes degradation of amplifier performance.

According to another aspect the present invention provides a method of controlling a control loop of an amplifier system. The method comprises detecting a controllable signal characteristic of the control loop of the amplifier system, the signal characteristic having a minimum attainable value, and adjusting the value of a control parameter of the control loop to adjust the controllable signal characteristic to a desired value above the minimum attainable value, the desired value of the controllable signal characteristic corresponding to a plurality of different control parameter values. The method further comprises adjusting the value of the control parameter to a steady state value comprising one of said plurality of control parameter values.

Further features and advantages are described in the following detailed description of the invention.

DETAILED DESCRIPTION OF THE INVENTION

Figure 1:
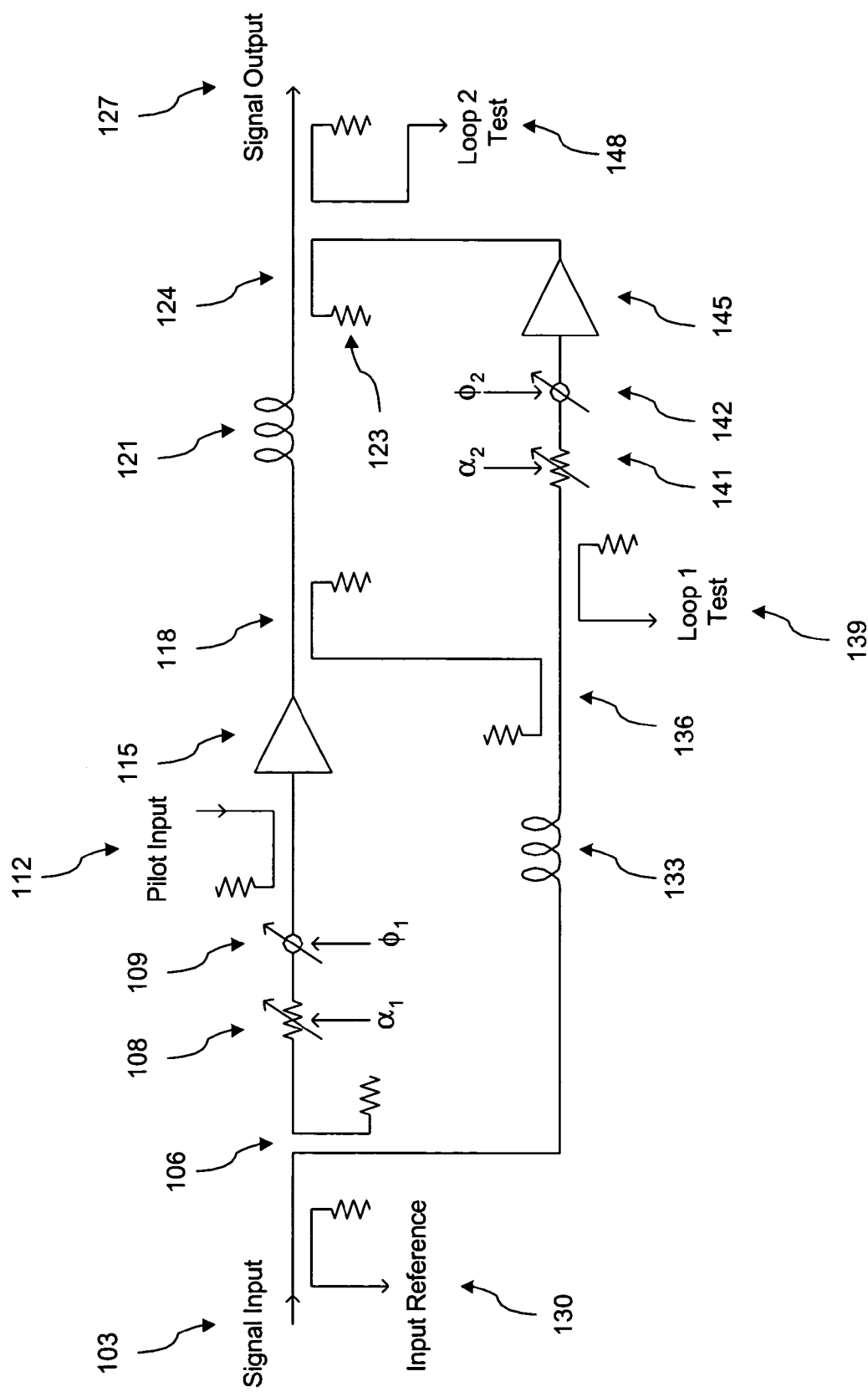
FIG. 1 is a block schematic drawing of a feed forward compensated power amplifier in accordance with the present invention.
Figure 2:
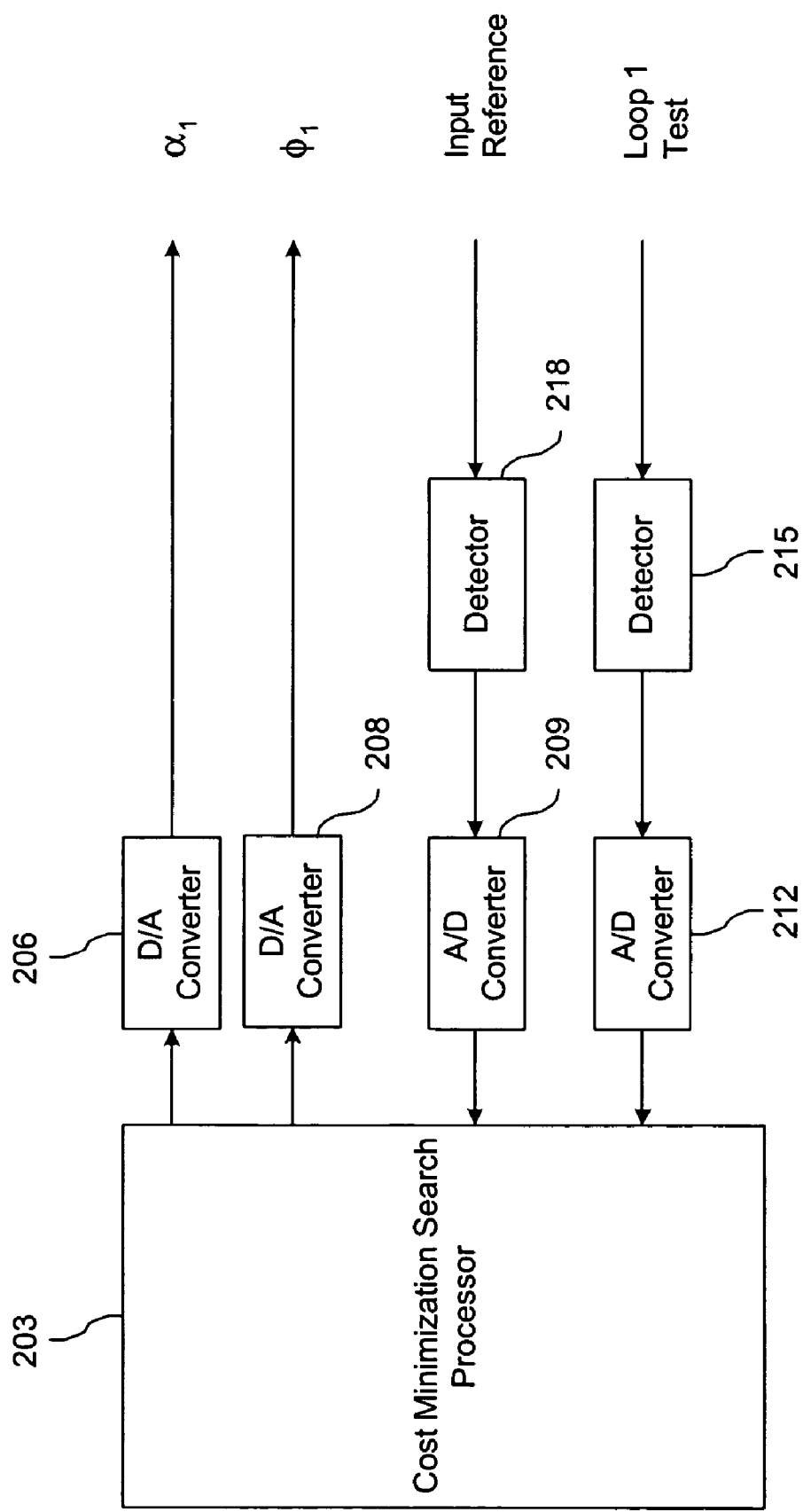
FIG. 2 is a block schematic drawing of a feed forward detection and control system in accordance with the present invention.

A block diagram of the feed forward compensated power amplifier (PA) system in accordance with a preferred embodiment of the present invention is shown in FIGS. 1 and 2. FIG. 1 illustrates the basic feed forward amplifier and FIG. 2 illustrates the controller.

As shown in FIG. 1, the feed forward amplifier has a conventional architecture employing two control loops. Loop 1 comprises signal input 103, sampling coupler 106, gain adjuster 108, phase adjuster 109, (optional) pilot input 112, main amplifier 115, main sampling coupler 118, input reference coupler 130, delay 133, cancellation combiner 136, and loop 1 test coupler 139. Loop 2 comprises main sampling coupler 118, main path delay 121, error coupler 124, carrier cancellation combiner 136, loop 2 gain adjuster 141, loop 2 phase adjuster 142, error amplifier 145, loop 2 test coupler 148 and output 127. As shown in FIG. 2, the controller may comprise a processor 203 which implements a cost minimization search algorithm described in detail below. Digital to analog converters 206, 208 convert the digital control signals to analog signals which are provided to the gain and phase adjusters of FIG. 1. Signal power detectors 215 and 218 and analog to digital converters 209 and 212 in turn provide the sampled signals in digital form to processor 203.

First the basic principles of operation will be described. Controlling loop 1 involves the adjustment of the gain adjuster 108 and phase adjuster 109, denoted by $\alpha_1$ and $\phi_1$, to reduce the loop gain 130–139 measured from the input reference coupler 130 to the loop 1 test coupler 139, shown in FIG. 1. The gain and phase adjuster values are referred to herein as 'adjuster settings'. As used herein a gain adjuster setting may comprise either the value of a variable attenuation or a variable gain depending on the gain adjuster implementation and such alternate gain adjuster implementations are well known to those skilled in the art. For loop 2, the desired settings of the gain and phase adjusters, 141 and 142, denoted by $\alpha_2$ and $\phi_2$ respectively, minimize the distortion detected at loop 2 test 148. A pilot tone 112 may be injected before the main amplifier 115 to act as a known distortion, making loop 2 adjuster control easier. A predistorter may also be provided between the input coupler 106 and the main amplifier 115 to reduce distortion introduced by the main amplifier in a manner known to those skilled in the art.

As noted above, traditional feed forward controllers would operate to minimize the first loop carrier at first loop test coupler 139. First loop carrier minimization is also referred to as first loop cancellation. In this traditional control approach, the main amplifier output 115 includes both signal plus distortion. Minimizing the carrier at test coupler 139 produces a signal in the error path representing only the distortion output component of main amplifier 115. This error signal is then controlled in the second loop as described above to produce a destructive combination with the distortion component of the main amplifier output 115 in the feed forward error coupler 124.

As noted above, one problem with this traditional approach is error coupler loss. The output power capability of the system drops due to losses in the termination load 23 (or dump load) of the error coupler 124 that recombines the error path signal with the delayed 121 main path signal. To reduce this coupler loss, the gain adjuster 108 in the main path can be offset in the reduced gain direction. This loop 1 gain adjuster offset injects signal power into the error path, which is coupled in-phase with the delayed main signal, thereby reducing error coupler 124 coupling losses. Gain adjuster offset in the reduced direction therefore shifts some of the burden of output signal power generation from the main amplifier 115 to the error amplifier 145. A further benefit of reduced gain adjuster 108 offset is a reduction in main amplifier 115 output power. This reduction permits more linear main amplifier operation with both the output average and peak power reduced.

There is however a cost to gain adjuster offset in the reduced direction. This cost is increased peak power in the error path. When offsetting the gain adjuster 108 in the reduced direction, peaks in the signal power injecting into the error path add in phase with peaks in the distortion signal generated in the main amplifier 115. The error path, particularly the error amplifier 145, must be capable of amplifying these error path signal peaks without distortion. Distortion generated in the main amplifier 115 is cancelled by the second loop, but distortion generated by the error amplifier 145 is coupled to the feed forward output 127. The linearity of a feed forward system is determined by the linearity of the error amplifier 145 and the error signal generated by first loop cancellation adjustments.

The above discussion on error path peak power generation suggests that it would be possible to reduce peak power in the error path by offsetting the gain adjuster 108 in the increased gain direction. When offsetting gain adjuster 108 in the increased direction, peaks in the signal power injected into the error path add out of phase with peaks in the distortion signal generated in the main amplifier 115. The reduced error path peak power improves the linearity of the error amplifier 145 at the expense of increasing the power output requirements of the main amplifier 115.

Above, both the benefits and costs of various first loop gain adjuster control options were given. These benefits and costs are derived from gain adjuster settings offset from the carrier cancellation approach used in traditional feed forward systems. The present invention provides an improved feed forward amplifier and controller and method for providing steady-state control of the first loop to any desired gain adjuster offset. The desired gain adjuster offset can then be selected for reduced main amplifier 115 peak power output at the expense of higher error amplifier 145 peak power output or vice versa. The selection of offset value and direction can then be determined by the output power and linearity capabilities of main amplifier 115 and error amplifier 145 of the particular system. An additional parameter to consider in the offset selection is the input signal 103. Input signal characteristics such as peak-to-average ratio and signal bandwidth could also be considered when optimizing the feed forward system for a particular use at a particular time.

Figure 8:
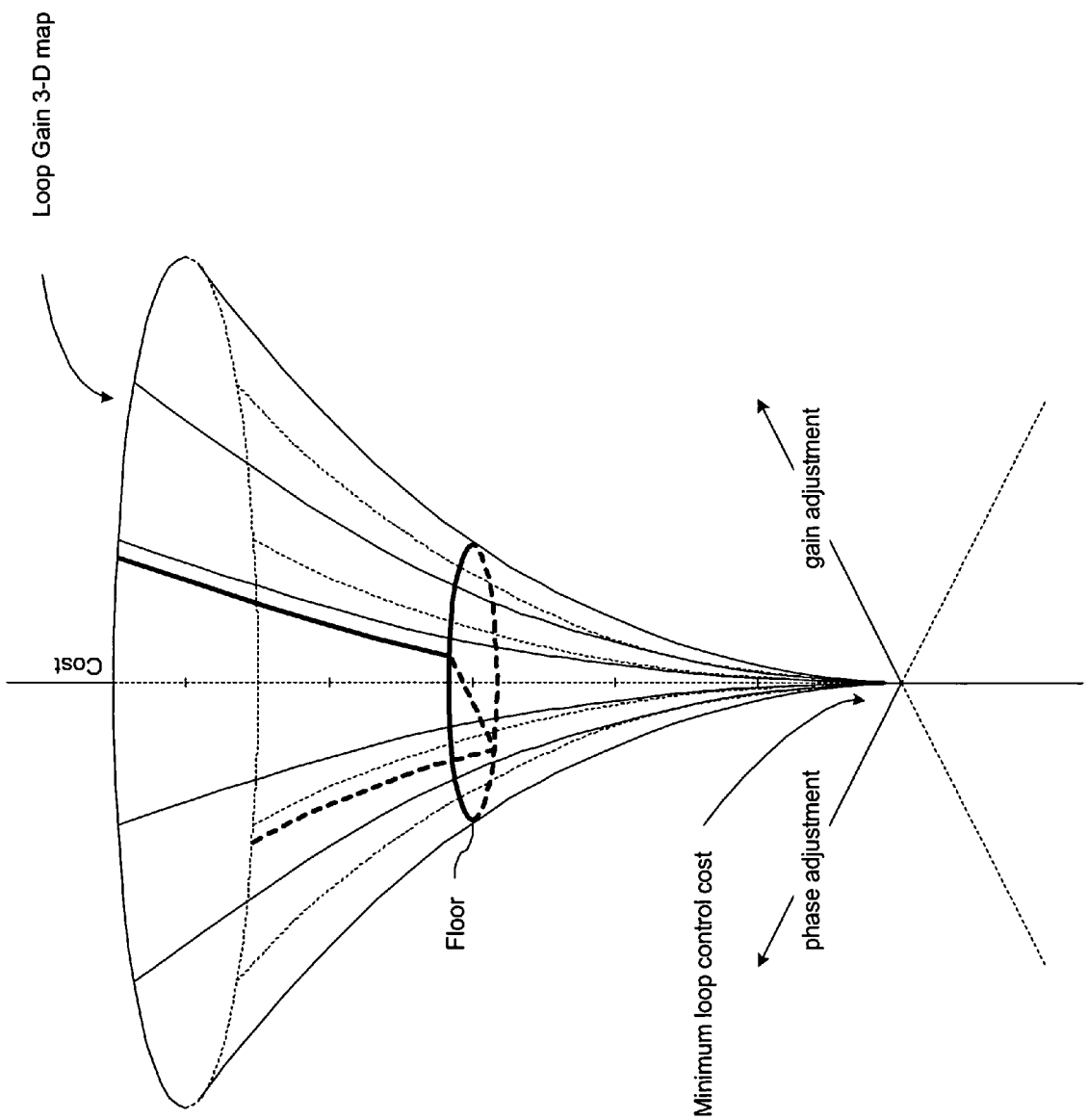
FIG. 8 is a three dimensional control cost diagram illustrating the control system and method of the present invention.
Figure 9:
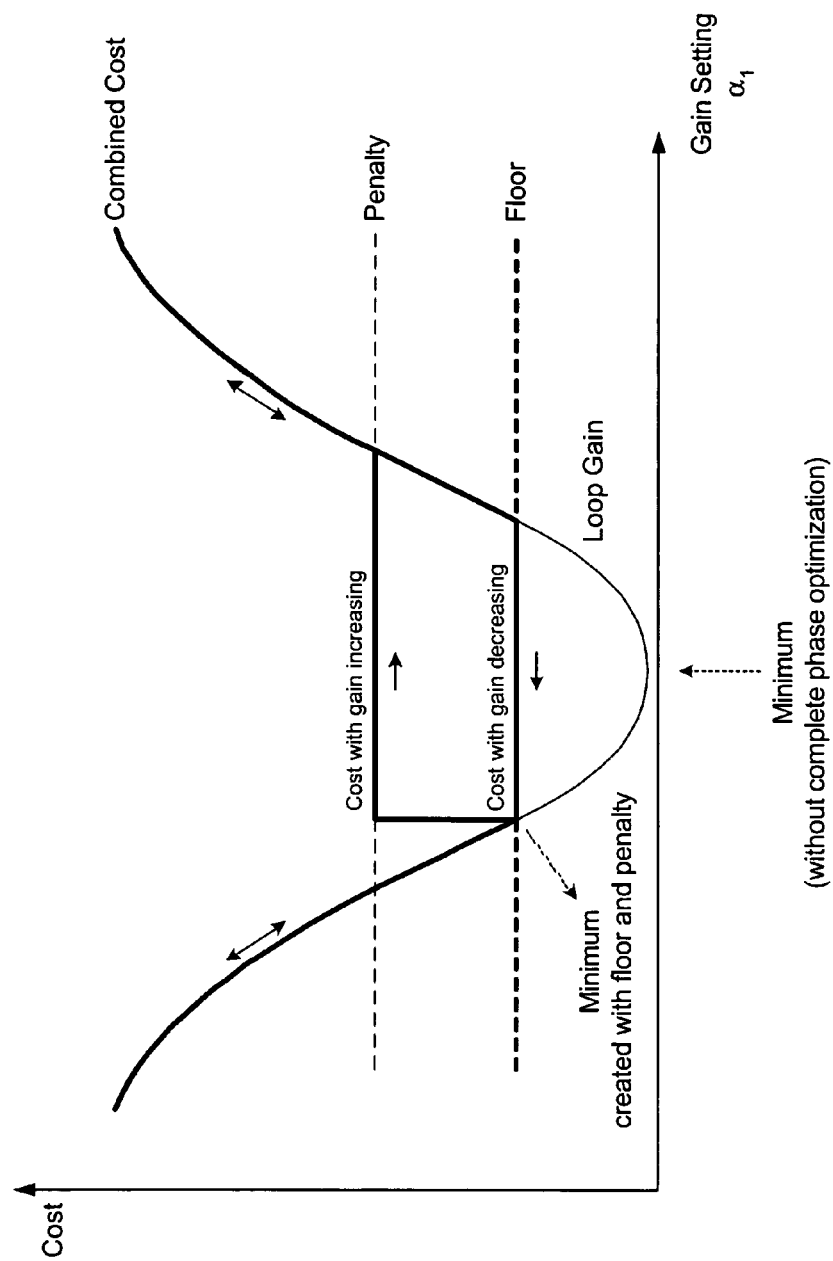
FIG. 9 is a two dimensional slice of the three dimensional control cost diagram of FIG. 8.

The present method allows the first loop gain adjuster setting to be offset in a repeatable and controlled manner. Applying floors and penalties to offset the steady-state gain adjuster setting modifies the traditional first loop carrier minimization approach. In the traditional case, the loop gain adjustment control function has a distinct minimum that corresponds to the desired adjustment setting. In the present approach, the measured loop gain is clipped to a lower bound or floor to produce a set of equal valued minimum control results. The floor is selected to place the desired gain offset at the edge of minimum floor, as shown in FIG. 8 and FIG. 9, discussed below. To ensure that the correct gain adjuster offset is selected from the set of equal valued minimum control results, a control direction based penalty is added. By including both the floor and penalty, the gain adjuster steady state offset will be controlled to the edge of the minimum floor.

Next, referring to FIGS. 1–9 a specific embodiment of the present invention will be described. The present invention provides a feed forward amplifier employing a controller and method for controlling the first loop gain adjuster 108 to a gain setting offset from the traditional first loop cancellation gain adjuster setting. The present invention is a modification to existing means and methods, several of which exist. The present invention can be applied to all of these presently available means and methods. In the interest of brevity, the present invention will be described by application to one commonly used means and method. Those skilled in the art will easily understand the application of the present invention to other commonly used first loop cancellation means and methods.

Loop control is an iterative process where a two-dimensional space of adjuster settings, gain and phase, is searched. The adjuster setting which provides the minimum loop gain is the desired steady-state value. A commonly used gain minimization search method is based on coordinate descent. A coordinate search, applied to the task of first loop gain minimization of a feed forward amplifier, makes adjustments along one of the coordinate directions at a time, alternating between the gain and phase. Also, the present invention can be equally applied to in-phase (I) and quadrature-phase (Q) adjusters and the controller can make the appropriate virtual gain and phase settings.

Control adjustment step size is another aspect of loop control. In general, large step sizes allow faster convergence, but have a greater possibility of instability and higher steady-state error. Small step sizes have better steady-state performance but have slow convergence. Effective control algorithms adjust step sizes dynamically to provide rapid convergence, stability, and small steady state control error. A commonly used step size selection approach adjusts step sizes as necessary depending on the rate of loop gain minimization.

Consider the feed forward amplifier block diagram shown in FIG. 1. The main path of the first loop includes a signal input 103, a gain adjuster 108, phase adjuster 109, and main amplifier 115. A coupled sample 118 of the main amplifier 115 output is combined 136 with a delayed 133 coupled sample 106 of the input signal 103. This combination completes the first loop. Adjusting the gain adjuster 108 and phase adjuster 109 will produce various degrees of signal cancellation. Signal cancellation is measured by power detecting and sampling the input reference coupler 130 and the loop 1 test coupler 139, and then calculating first loop gain. The controller for both controlling the first loop gain adjuster 108, phase adjuster 109, and sampling the input reference coupler 130 and loop 1 test coupler 139 is shown in FIG. 2. An ideal three-dimensional mapping of loop 1 cancellation as a function of gain adjuster and phase adjuster control is shown in FIG. 8. This mapping can also be described as the cost function for loop control. Traditional feed forward systems would control the gain and phase adjuster to produce minimum cost. The present invention will alter the loop gain based cost function by including floors and penalties. By including floors and penalties, control to steady-state gain adjuster offset will be achieved.

Figure 3:
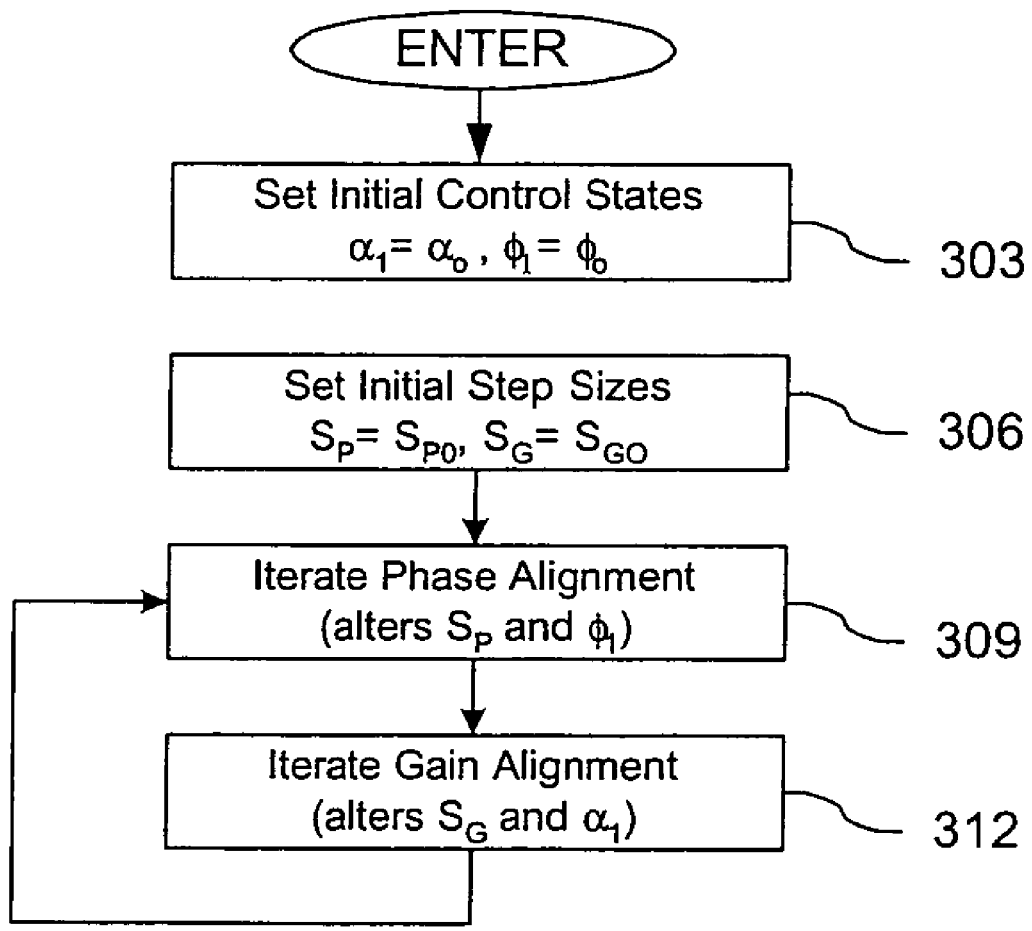
FIG. 3 is a block schematic drawing of a first loop control processing algorithm in accordance with the present invention.

FIG. 3 provides a block diagram for a coordinate based loop control algorithm. The algorithm begins by setting loop 1 gain adjuster 108 and phase adjuster 109 starting values 303. Next, initial gain adjuster and phase adjuster step sizes are selected 306. The algorithm then iterates between phase adjustments 309 and gain adjustments 312. A phase adjustment optimizing algorithm, shown in FIG. 5, exists within the iterate phase adjustment block 309. A gain adjustment optimizing algorithm, shown in FIG. 4, exists within the iterate gain adjustment block 312. Both the gain and phase adjustment algorithms include a step size control method. FIG. 3 does not include an exit. In practical systems, an exit may need to be added for cases when the input signal amplitude is not adequate to provide a detectable signal at either detector 215 or 218 in FIG. 2. An exit strategy would be application dependent, and its implementation for a specific application should be apparent to those skilled in the art.

Figure 4:
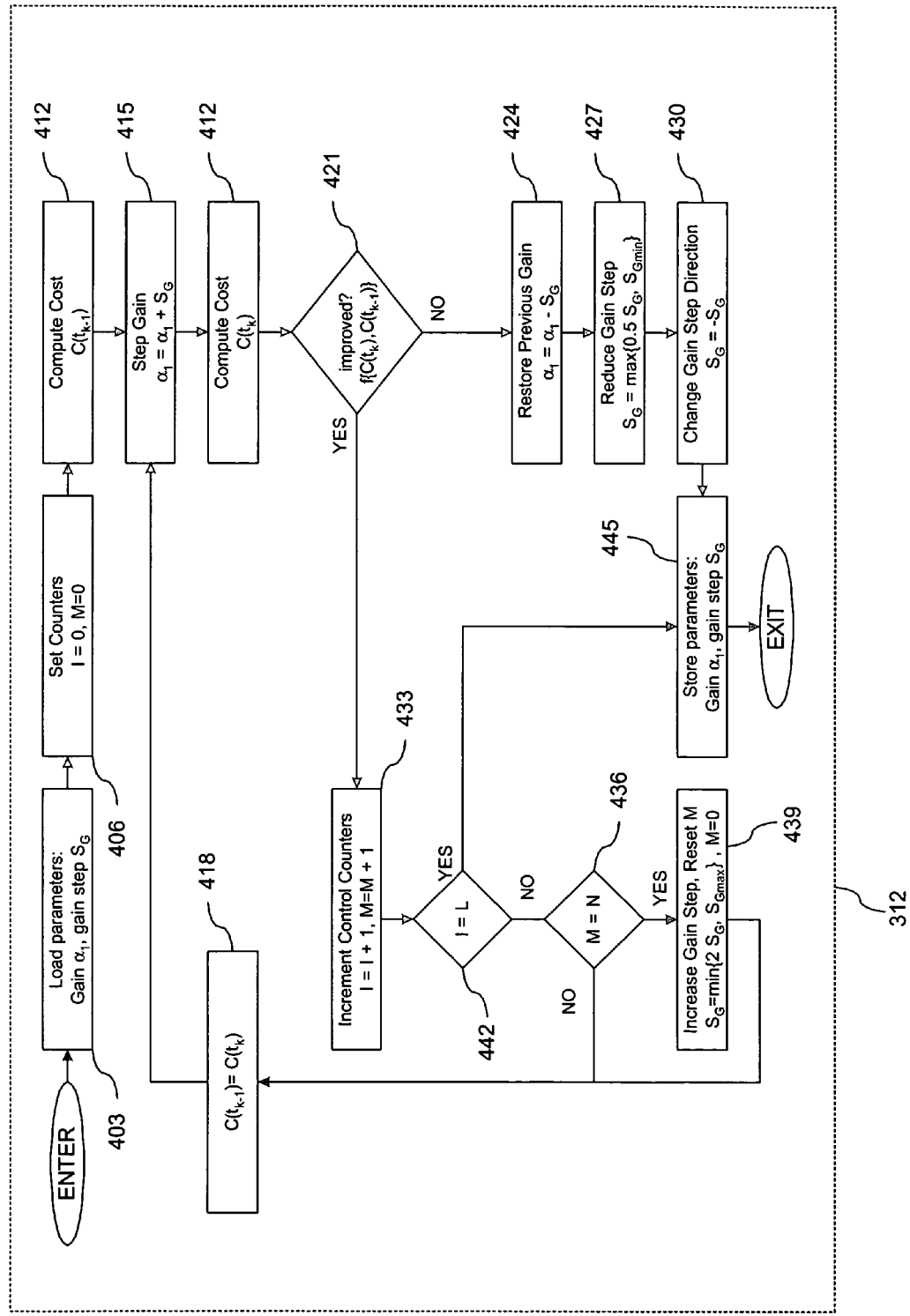
FIG. 4 is a block schematic drawing of a first loop gain control processing algorithm in accordance with the present invention.

FIG. 4 contains the gain adjuster control algorithm 312. The steps shown in this algorithm provide a step size controlled cost function minimization algorithm. Upon entering the algorithm, the current gain adjuster value and gain control step size are loaded from memory 403. Control counters are then set which monitor the total number of adjustments "I", and the number of consecutive adjustment improvements "M" 406. The first loop cost is then measured 412. (A block diagram of the cost function algorithm is found in FIG. 6.) A gain step is then taken 415 followed by a second control cost measurement. These two cost measurements are then used to determine if the loop control improved 421. If the control did improve, both the total "I" and the improve "M" counters are incremented 433. The total adjustment counter "I" is then compared to a maximum adjustment constant "L" 442. If maximum adjustment constant is reached, the gain adjuster value and control step size are stored 445 and the loop is exited for phase adjustments. If the maximum adjustment constant "L" was not reached, the improve counter "M" is then compared to a user defined control damping constant "N" 436. If the improve counter "M" is less than "N", the first cost measurement is set equal to the second cost measurement 418 and the control is looped back for additional gain steps 415. If the number of consecutive improvements equals "N" 436, then the gain step size is doubled but bounded to the maximum gain step ($S_{Gmax}$) and the improve counter "M" is reset to zero 439. Following the change in step size and improve counter reset 439, the first cost measurement is set equal to the second cost measurement 418 and the control is looped back for additional gain steps 415. If the evaluation of two measured costs 412 determines that the loop adjustment did not improve, the gain is restored to its previous value 424. After restoring the gain, the gain step size is halved but bounded to the minimum gain step ($S_{Gmin}$) 427, and the gain step direction is reversed 430. Finally the current gain adjuster control value and current step size are stored 445 and the loop is exited for phase adjustments.

In the above gain control algorithm the gain step size is doubled every time "N" consecutive loop control improvements are made. The damping constant "N" determines how fast the gain control accelerates towards the desired adjustment setting. If "N" were set equal to 1, gain adjuster control steps would double with each improvement. Such control would be rapid but may be unstable or cause large overshoot from the desired steady-state value. If "N" were set to a large number, step sizes would rarely increase causing slow convergence. Typically an "N" value in the 2 to 4 range is ideal.

In the above gain control algorithm, gain adjustments are stopped after "L" gain adjustments. This exit method is included to prevent the possibility of an infinite control loop. For example, "L" may be set to three to five times the damping constant "N."

In the above gain control algorithm, the gain step size is halved and direction reversed with each detrimental control adjustment. The algorithm assumes that the previous gain step overshot the desired control setting. By cutting the control step size in half with each detrimental adjustment, each subsequent overshoot will be smaller than the previous. The algorithm also shows moving on to phase adjustment immediately after one detrimental gain adjuster control step. As an alternative, one could change step direction after each detrimental gain adjuster step and then count some number direction changes before halving the gain step and moving on to phase adjustments. Such a method does help for the first gain step, if that step causes a detrimental adjustment. Generally however, increasing the number of detrimental adjustments to more than 1 simply slows convergence. If such a counter is added the number of detrimental adjustments should never be more than 2 before halving the gain step size and exiting for phase adjustments.

Figure 5:
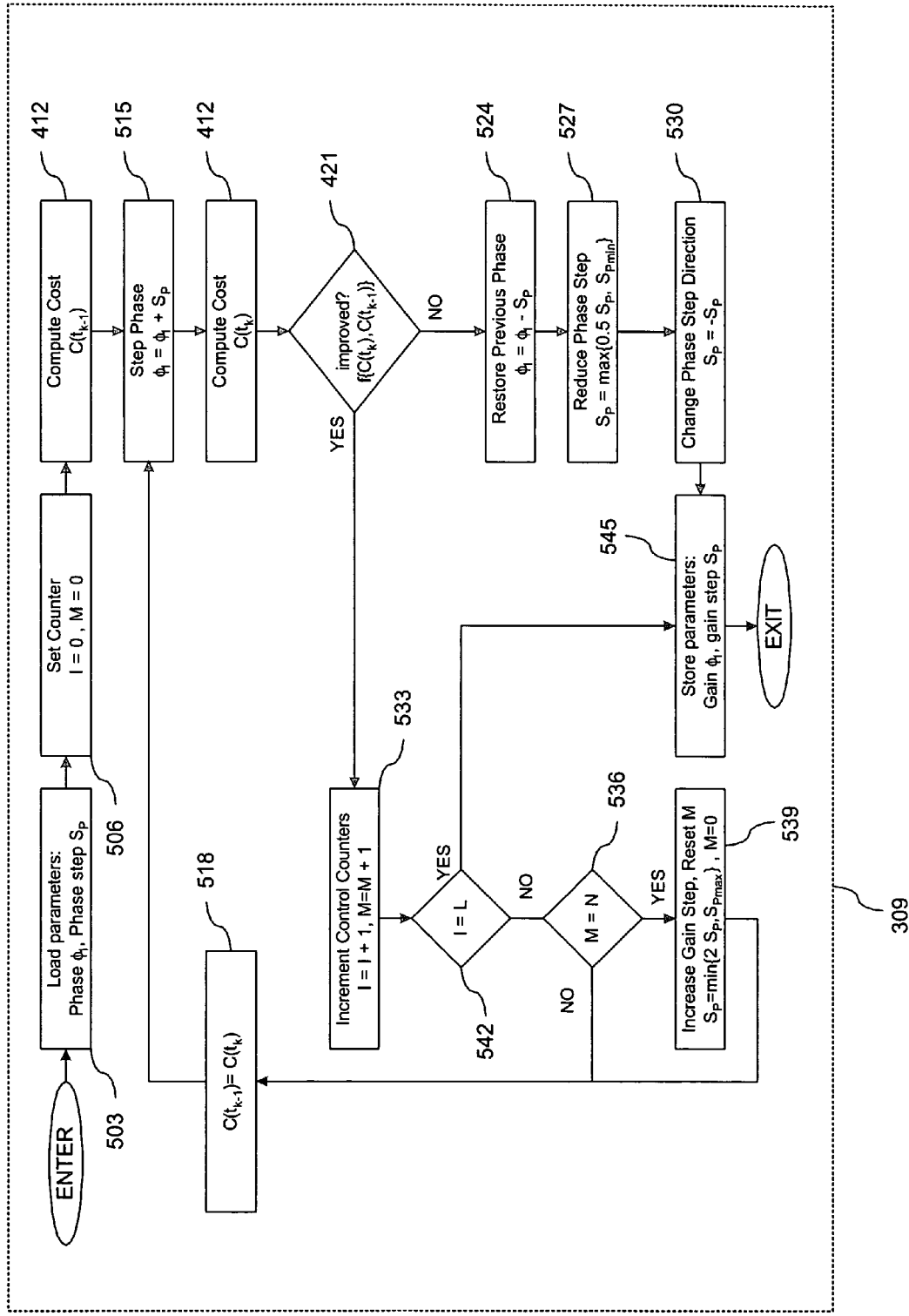
FIG. 5 is a block schematic drawing of a first loop phase control processing algorithm in accordance with the present invention.

FIG. 5 shows an identical process for phase control 309. The description of phase adjuster 109 control follows that of gain adjuster control exactly with phase adjuster values and phase steps substituted for gain adjuster 108 values and gain steps. The difference in phase and gain control is found in how loop control costs and loop improvements are determined.

Figure 6:
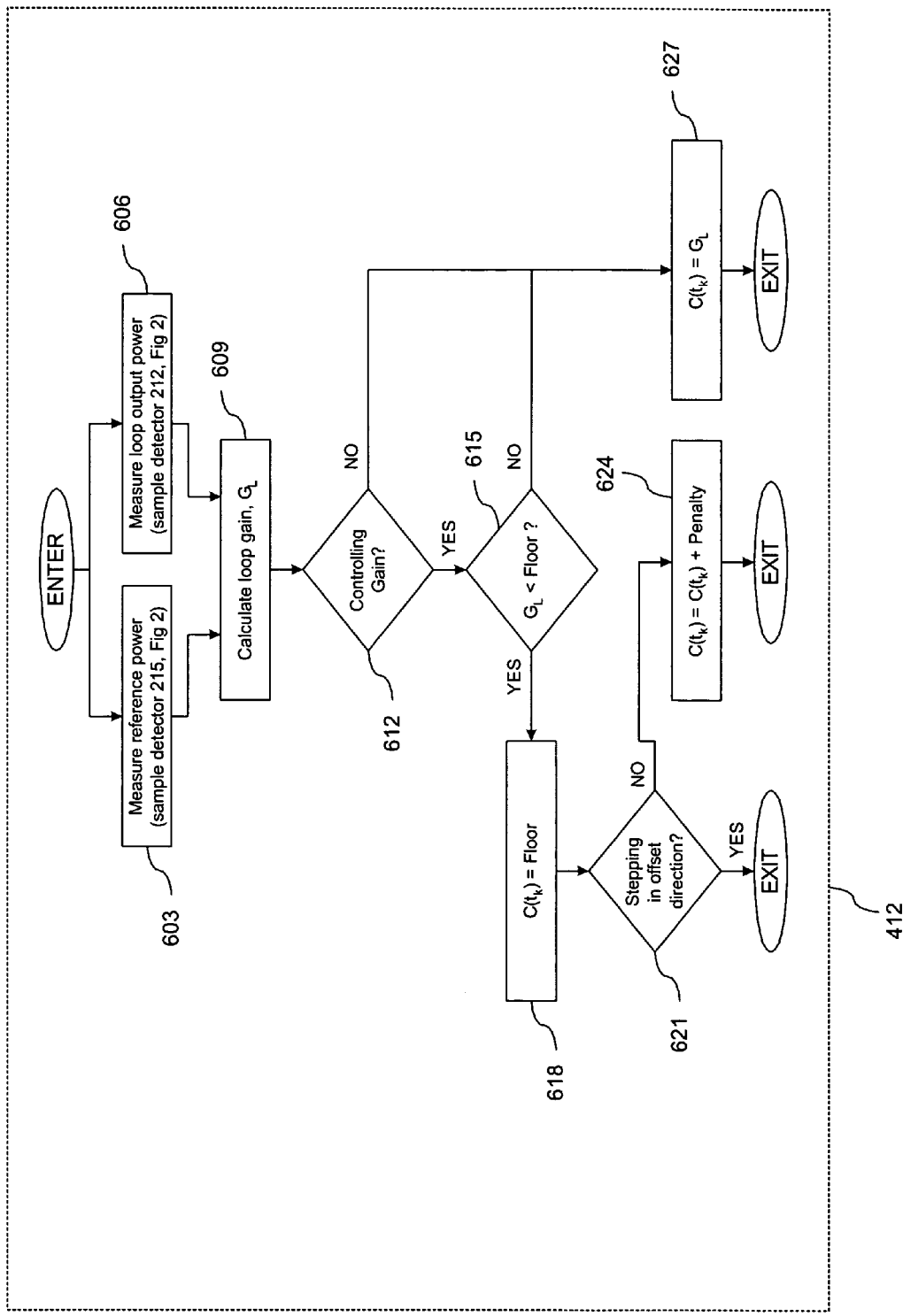
FIG. 6 is a block schematic drawing of a control cost processing algorithm in accordance with the present invention.

FIG. 6 provides the loop control cost calculator. After entering the cost calculator, power measurements are made from the feed forward amplifier. Loop control costs are determined from these measurements. First, the processor 203 sets the gain adjuster 108 and phase adjuster 109. The processor then measures the power found at feed forward input coupler 130 and the loop 1 test coupler 139 using detectors 215 and 218 and analog to digital converters 209 and 212. These power measurements are shown in blocks 603 and 606 of FIG. 6. Both power measurements should be taken at the same instant in time, however analog and digital signal processing may allow for some small time difference. From these power measurements the loop gain can be calculated 609. If the cost calculator is operated from the phase algorithm 309, the control costs are set equal to the loop gain 627 and the calculator is exited. If the cost calculator is operated from the gain algorithm 312, the loop gain is compared 615 to a cost floor. If the loop gain is higher than the floor, the cost is set equal to the loop gain 627 and the cost calculator is exited. If the loop gain is lower than the floor the cost is set equal to the floor 618. Next the desired direction of control offset is determined 621. (If for example, the gain adjustment is currently stepping in the reduced gain adjustment direction, and a reduced gain adjustment offset is desired, i.e., an adjustment offset which reduces main amplifier peak power, the determination at 621 is a yes.) If the gain adjustment is currently moving in the desired direction of control, the cost calculator is exited. If the control is moving in the opposite direction of desired offset, a penalty is added to the cost 624 and then the cost calculator is exited.

FIG. 8 and FIG. 9 show graphically how the cost calculator works. FIG. 8 shows a three-dimensional plot of an ideal first loop cost function. Both gain and phase setting determine the loop gain. Both the gain adjuster 108 and phase adjuster 109 can be controlled to increase or decrease loop gain. When adjusting phase, the control cost is determined directly from the loop gain map. When controlling the gain adjuster 108, a floor is placed at a specific level of loop gain. FIG. 8 includes a cost trace without penalty where the gain adjuster 108 is varied and the phase adjuster 109 is held constant with a slight offset from best phase adjustment. Both of these traces are reproduced in FIG. 9. Also included in FIG. 9 is the cost effect of including a penalty for increasing gain adjustment, i.e., increasing the gain adjuster setting. Such a penalty will favor gain adjuster setting offsets in the reduced direction. The penalty could have been applied to reducing the gain adjuster setting and is equally described by FIG. 9. If the penalty were applied to reducing gain adjustment, the floor and penalty cost minimum would simply have been placed at the higher adjuster setting gain edge of the floor boundary.

Figure 7:
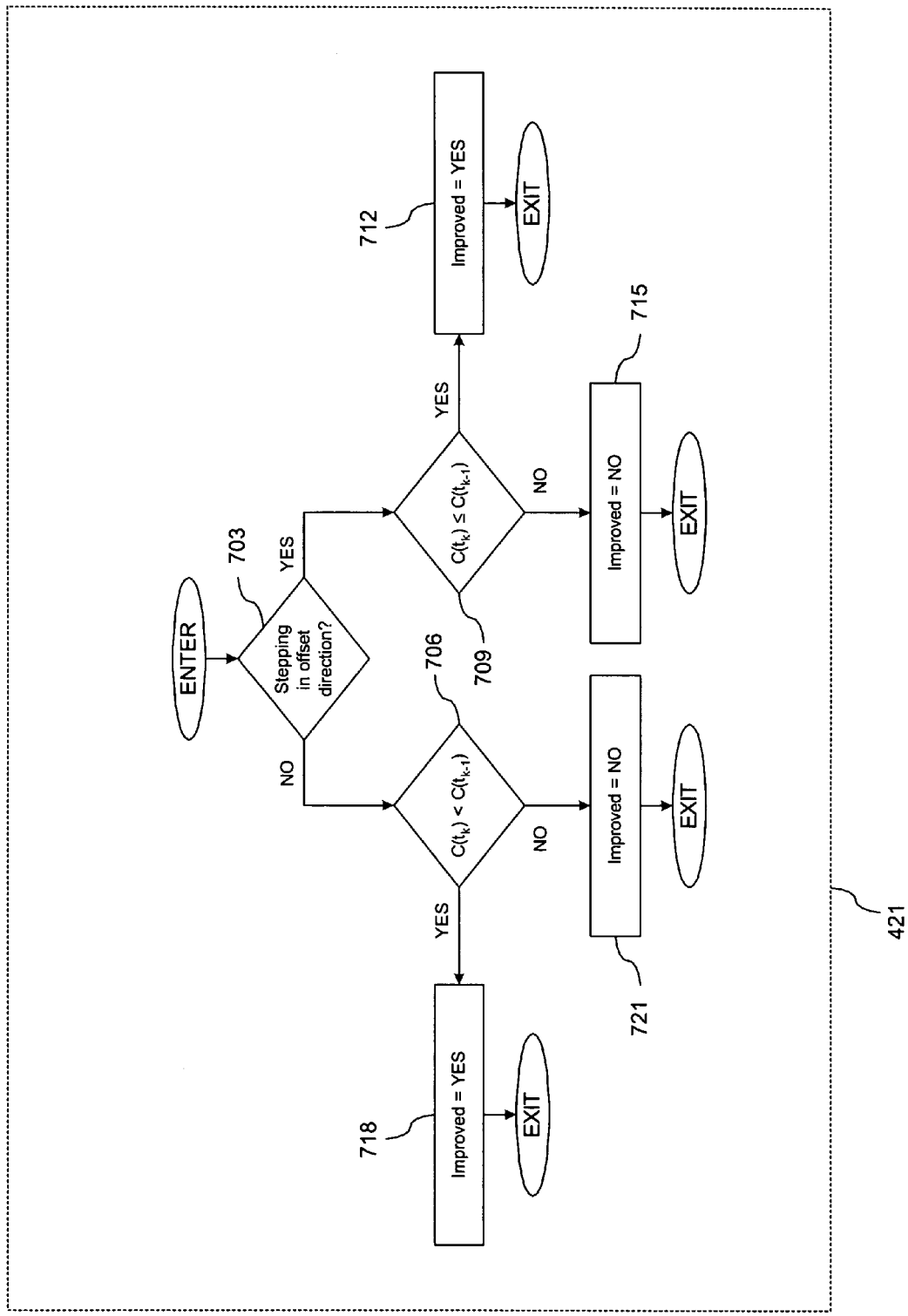
FIG. 7 is a block schematic drawing of a control improvement determination algorithm in accordance with the present invention.

Finally, FIG. 7 shows the control improvement calculator. The control improvement calculator primarily determines that loop control improves when the second measured cost is lower then the first measured cost. A problem however may arise if the first and second measured costs are equal. The control improvement calculator determines if a control improvement occurred, based on the control step direction and the direction of desired gain adjuster setting offset 703. If the gain adjustment is currently stepping in the direction of the desired offset, an equal second adjustment will be considered improved control 709. If the gain adjuster control is currently stepping in a direction opposite from the desired offset direction, an equal second adjustment will be considered detrimental control 706. By determining the equal cost cases in this way, an infinitely small penalty is placed on stepping in the opposite from desired direction. This alone will tend to push control offset in the desired direction. A larger fixed penalty should however still be added, as was done in FIG. 6, to avoid control confusion in the presence of noise. With the penalty added as described in FIG. 6, a control calculator that always assigns improved performance to consecutive equal costs will in most cases operate without problem. The control improvement calculator given in FIG. 7 however removes any control ambiguity for equal costs.

Generally speaking, the penalty value used in the described control algorithm can be set to any arbitrary large value. If the gain control sets the cost just at the floor boundary, but no penalty is added, a step of the gain adjuster setting away from the penalty direction should always produce a cost increase smaller than the cost increase caused by stepping in the penalty direction. Since step sizes can vary as described in FIG. 4 the goal should be to set the penalty cost higher than the cost produced by the maximum allowable gain adjuster setting step in the direction opposite of the penalty.

The floor value could be calculated based on desired results. To overcome error coupler 124 losses for example, the amount of signal leakage caused by a reduced gain adjuster 108 setting offset can be calculated based on the error coupler 124 coupling value. With this leakage value known, the amount of gain adjuster 108 setting offset in the reduced direction can be calculated. Generally speaking, however, this need not be done. Instead the floor can first be set to a very low value. The penalty direction can be set to increasing gain adjuster setting. The feed forward amplifier will then be controlled to the minimum loop gain setting. The floor can then be slowly increased while monitoring amplifier linearity. The linearity of the amplifier should improve as the amount that the gain adjuster setting is offset in the reduced direction is increased with the increasing floor value. At some point, the linearity of the error amplifier 145 will compromise feed forward performance. The floor can then be reduced to provide some error amplifier 145 headroom. In the example of a very small error amplifier, the procedure would be the same except the penalty would be set in the decreasing gain adjuster setting direction. Now as the floor is increased, the main amplifier 115 would be driven harder to reduce error path peak power by offsetting the gain adjuster 108 setting in the increasing direction. In this small error amplifier 145 case, at some point the linearity of the main amplifier 115 will compromise feed forward linearity. At such a point the floor would be reduced to provide main amplifier 115 headroom.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. A feed forward amplifier, comprising:
   an input for receiving an RF signal;
   a main amplifier receiving and amplifying said RF signal;
   a gain adjuster coupled between the RF input and the main amplifier;
   a main amplifier output sampling coupler;
   a first delay coupled to the input and providing a delayed RF signal;
   a carrier cancellation combiner coupling the delayed RF signal to the sampled output from the main amplifier;
   a test coupler for sampling the output of the carrier cancellation combiner;
   an error amplifier receiving and amplifying the output of the carrier cancellation combiner;
   a second delay coupled to the output of the main amplifier;
   an error coupler combining the output from the error amplifier and the delayed main amplifier output from the second delay so as to cancel distortion introduced by the main amplifier;
   an output coupled to the error coupler output and providing an amplified RF signal; and
   an adaptive controller, coupled to the test coupler, for controlling the gain adjuster setting to provide a gain adjustment which is offset from a gain adjustment which maximizes carrier cancellation at the carrier cancellation combiner, which offset is adjustable by changing the floor of a gain adjustment cost function.

2. A feed forward amplifier as set out in claim 1, further comprising an input reference coupler for sampling the RF signal provided to the input and wherein the adaptive controller is coupled to the input reference coupler and derives a first loop gain value from the signals from the test coupler and input reference coupler.

3. A feed forward amplifier as set out in claim 2, further comprising a first signal power detector and a first analog to digital converter coupled between the input reference coupler and the controller and a second signal power detector and a second analog to digital converter coupled between the test coupler and the controller.

4. A feed forward amplifier as set out in claim 1, further comprising a phase adjuster coupled between the input and the main amplifier.

5. A feed forward amplifier as set out in claim 4, wherein the controller controls the phase adjuster to provide a phase adjustment which maximizes carrier cancellation at the carrier cancellation combiner.

6. A feed forward amplifier as set out in claim 1, wherein said adaptive controller comprises a processor implementing a cost minimization search algorithm.

7. A feed forward amplifier as set out in claim 6, wherein said cost minimization search algorithm includes a penalty based on the direction of gain adjustment.

8. A feed forward amplifier as set out in claim 1, further comprising a source of a pilot signal which is injected into the signal path before said main amplifier and a pilot signal detector coupled to the output and wherein the controller receives the detected pilot signal.

9. A feed forward amplifier as set out in claim 8, further comprising a second gain adjuster and a second phase adjuster coupled between the carrier cancellation combiner and the error amplifier and wherein the controller adjusts the setting of the second gain adjuster and second phase adjuster based on the detected pilot signal.

10. A feed forward amplifier, comprising:
    an input for receiving an RF input signal;
    a first control loop coupled to the input and comprising a main amplifier, a sampling coupler, a delay, and a cancellation combiner, the first control loop having a gain;
    a second control loop coupled to the first control loop and comprising a delay, an error amplifier, and an error coupler;

an output coupled to the error coupler;

means for detecting the first control loop gain; and means, coupled to the means for detecting, for controlling the first control loop gain to stabilize said control loop gain at a value offset from a minimum of a loop gain control function.

11. A feed forward amplifier as set out in claim 10, wherein said means for controlling comprises a gain adjuster in said first control loop between the input and main amplifier and a processor implementing a loop control algorithm and providing variable adjuster settings to said gain adjuster.

12. A feed forward amplifier as set out in claim 11, wherein said means for detecting comprises an input reference coupler coupled to the input and a test coupler coupled to the output of the carrier cancellation combiner.

13. A feed forward amplifier as set out in claim 12, wherein said means for detecting further comprises a first signal power detector coupled to said input reference coupler and a second signal power detector coupled to said test coupler.

14. A feed forward amplifier as set out in claim 13, wherein said means for detecting further comprises a first analog to digital converter coupled to said first signal power detector and outputting a first digital power signal to said processor and a second digital to analog converter coupled to said second signal power detector and outputting a second digital power signal to said processor.

15. A feed forward amplifier as set out in claim 14, wherein said processor determines said first control loop gain from the first and second digital power signals.

16. A feed forward amplifier as set out in claim 11, wherein said processor and algorithm calculate a cost function associated with the adjuster settings which is derived from the detected first control loop gain and a preset floor value of the cost function.

17. A feed forward amplifier as set out in claim 16, wherein said processor and algorithm vary said adjuster settings employing said cost function to move the calculated cost function toward the preset floor value.

18. A feed forward amplifier as set out in claim 17, wherein said processor and algorithm further add a penalty to the cost function if the cost function is at the floor value and the adjuster setting is moving in an undesired direction.

19. A feed forward amplifier as set out in claim 18, wherein the undesired direction corresponds to increasing gain adjuster settings.

20. A feed forward amplifier as set out in claim 18, wherein the undesired direction corresponds to decreasing gain adjuster settings.

21. A method for amplifying an RF input signal employing feed forward compensation, comprising:

receiving an RF input signal;

amplifying said RF input signal employing a main amplifier;

sampling the main amplifier output;

delaying the RF input signal and providing a delayed RF input signal;

coupling the delayed RF input signal to the sampled output from the main amplifier so as to cancel at least a portion of a carrier component of said sampled output from the main amplifier and provide a carrier canceled signal having a carrier component and a distortion component;

amplifying the carrier canceled signal employing an error amplifier to provide an error signal;

delaying the output of the main amplifier;

combining the error signal and the delayed output of the main amplifier so as to cancel distortion introduced by the main amplifier and providing an amplified RF output;

adjusting the gain of the signal input to said main amplifier by a variable gain setting; and controlling said adjusting of the gain of the signal to a steady state setting offset from a setting which minimizes the carrier component of said carrier canceled signal by employing a gain control cost function having a floor and a penalty associated with the direction of said adjusting.

22. A method for amplifying an RF input signal employing feed forward compensation as set out in claim 21, wherein said penalty is associated with increasing the gain of the signal and said steady state setting is offset below a setting which minimizes the carrier component of said carrier canceled signal.

23. A method for amplifying an RF input signal employing feed forward compensation as set out in claim 21, wherein said penalty is associated with decreasing the gain of the signal and said steady state setting is offset above a setting which minimizes the carrier component of said carrier canceled signal.

24. A method for amplifying an RF input signal employing feed forward compensation as set out in claim 21, wherein the floor of said cost function defines a plurality of gain settings having equal cost.

25. A method for amplifying an RF input signal employing feed forward compensation as set out in claim 24, wherein said steady state setting comprises one of said plurality of gain settings having equal cost.

26. A method for amplifying an RF input signal employing feed forward compensation as set out in claim 25, wherein said steady state setting comprises the lowest gain setting having equal cost.

27. A method for amplifying an RF input signal employing feed forward compensation as set out in claim 25, wherein said steady state setting comprises the highest gain setting having equal cost.

28. A method for amplifying an RF input signal employing feed forward compensation as set out in claim 21, wherein said gain control cost function has a lower boundary defined by said floor, said lower boundary having first and second edges.

29. A method for amplifying an RF input signal employing feed forward compensation as set out in claim 28, wherein said steady state setting corresponds to one of said first and second edges of said lower boundary of the cost function.

* * * * *